United States Patent
Chou

(10) Patent No.: US 10,250,065 B2
(45) Date of Patent: Apr. 2, 2019

(54) WIRELESS CHARGING CIRCUIT AND CHARGING BOARD THEREOF

(71) Applicants: DEXIN ELECTRONIC LTD., Donggaun, Guangdong (CN); DEXIN CORPORATION, New Taipei (TW)

(72) Inventor: Pai-Yang Chou, New Taipei (TW)

(73) Assignees: DEXIN ELECTRONIC LTD., Dongguan, Guangdong (CN); DEXIN CORPORATION, New Taipei (TW)

( * ) Notice: Subject to any disclaimer, the term of this patent is extended or adjusted under 35 U.S.C. 154(b) by 154 days.

(21) Appl. No.: 15/417,163

(22) Filed: Jan. 26, 2017

(65) Prior Publication Data

US 2018/0212452 A1 Jul. 26, 2018

(51) Int. Cl.

| H02J 7/00 | (2006.01) |
|---|---|
| H02J 7/02 | (2016.01) |
| H02J 50/12 | (2016.01) |
| H03B 5/24 | (2006.01) |
| H03H 7/42 | (2006.01) |
| H03H 7/01 | (2006.01) |

(52) U.S. Cl.
CPC .............. H02J 7/025 (2013.01); H02J 50/12 (2016.02); H03B 5/24 (2013.01); H03H 7/0115 (2013.01); H03H 7/175 (2013.01); H03H 7/42 (2013.01)

(58) Field of Classification Search
USPC .................................. 320/104, 107, 108, 110
See application file for complete search history.

(56) References Cited

U.S. PATENT DOCUMENTS

| 9,789,777 | B2* | 10/2017 | Mi ........................ | B60L 11/182 |
| 2010/0184371 | A1* | 7/2010 | Cook ...................... | H02J 5/005 |
| | | | | 455/41.1 |
| 2012/0149303 | A1* | 6/2012 | Moes ................... | H04B 5/0025 |
| | | | | 455/41.1 |
| 2013/0154383 | A1* | 6/2013 | Kasturi ................ | H04B 5/0087 |
| | | | | 307/104 |
| 2016/0087481 | A1* | 3/2016 | Jiang ....................... | H02J 50/10 |
| | | | | 320/108 |
| 2016/0254704 | A1* | 9/2016 | Hansen ................... | H02J 50/90 |
| | | | | 307/104 |
| 2017/0098960 | A1* | 4/2017 | Nalbant .................. | H02J 50/12 |

* cited by examiner

Primary Examiner — Brian Ngo
(74) Attorney, Agent, or Firm — Li & Cai Intellectual Property (USA) Office

(57) ABSTRACT

A wireless charging circuit coupled to an oscillation unit. The wireless charging circuit includes a balun unit, a higher-order filter unit and a differential unit. The balun unit is coupled to the oscillation unit. The higher-order filter unit is coupled to the balun unit. The differential unit is coupled to the higher-order filter unit. The differential unit is coupled to a transmission coil. The oscillation unit issues a differential signal to the balun unit, and then the balun unit converts the differential signal into a converted signal to be transmitted to the higher-order filter unit. The higher-order filter unit filters the converted signal to output a filtered signal to the differential unit. The differential unit converts the filtered signal into a differential output signal to be outputted by the transmission coil.

13 Claims, 5 Drawing Sheets

WIRELESS CHARGING CIRCUIT AND CHARGING BOARD THEREOF

BACKGROUND

1. Technical Field

The present invention generally relates to a wireless charging circuit and a charging board thereof and, more particularly, to a wireless charging circuit coupled to an oscillator and a charging board thereof.

2. Description of Related Art

FIG. 1 is a schematic diagram of a conventional wireless charging circuit of a wireless charging board. FIG. 1A is a waveform diagram of waveforms of an input signal before and after being converted by the switch of an oscillator on a conventional wireless charging board in FIG. 1. With reference to FIG. 1 and FIG. 1A, FIG. 1 discloses a conventional wireless charging board including an oscillator OSC, a filter circuit FC, a differential circuit DU and a transmission coil Co. The filter circuit FC is coupled between the oscillator OSC and the differential circuit DU. The differential circuit DU is coupled to the transmission coil Co. The transmission coil Co is configured to deliver electric energy to wireless receiving devices, such as wireless mice, keyboards, headphones, and so on.

In practice, the switch of the oscillator OSC receives a square-wave signal W1, which indicates whether the switch is turned on or off. Therefore, the oscillator OSC then generates a differential signal, for example, the sinusoidal W2 to be transmitted to the filter circuit FC. During the conversion from the square-wave signal W1 into the sinusoidal signal W2, the energy denoted by the residual portion Re as shown in FIG. 1A is still stored in the circuit or the capacitors. The energy denoted by the residual portion Re is transmitted to the transmission coil Co, and then the transmission coil Co transmits the energy denoted by the residual portion Re to wireless receiving devices to affect the wireless receiving devices with electromagnetic interference or other noise issues.

Moreover, the conventional filter circuit FC includes a plurality of inductors and a plurality of capacitors. Either the capacitors or the inductors store energy, which causes noise interference at a frequency multiplied. Therefore, the conventional wireless charging board often fails to overcome the problems related to electromagnetic interference (EMI) or the safety issues due to electromagnetic interference at 6.78 MHz, which leads to inconvenience when using the wireless charging board or safety issues due to electromagnetic interference.

SUMMARY

Accordingly, the present invention provides a wireless charging circuit and a charging board thereof, using a balun unit and a higher-order filter unit to thereby enhance the convenience of the wireless charging circuit and the charging board thereof.

The present invention provides a wireless charging circuit coupled to an oscillation unit configured to generate a differential signal. The wireless charging circuit includes a balun unit, a higher-order filter unit and a differential unit. The balun unit is coupled to the oscillation unit. The higher-order filter unit is coupled to the balun unit. The differential unit is coupled to the higher-order filter unit and a transmission coil. The oscillation unit transmits the differential signal to the balun unit, and then the balun unit converts the differential signal into a converted signal to be transmitted to the higher-order filter unit. The higher-order filter unit filters the converted signal to output a filtered signal to the differential unit. The differential unit converts the filtered signal into a differential output signal to be outputted by the transmission coil.

The present invention provides a wireless charging board including an oscillation unit and a wireless charging circuit. The oscillation unit is coupled to a balun unit of the wireless charging circuit. The oscillation unit is configured to generate a differential signal to be transmitted to the balun unit.

As previously stated, the present invention provides a wireless charging circuit, using a balun unit and a higher-order filter unit, such that the balun unit converts a differential signal into a converted signal to be transmitted to the higher-order filter unit and the higher-order filter unit filters the converted signal conduct, such that the wireless charging circuit provides higher-order attenuated and filtered power and enhances the convenience of the wireless charging circuit and the charging board thereof.

In order to further understand the techniques, means and effects of the present invention, the following detailed descriptions and appended drawings are hereby referred to, such that, and through which, the purposes, features and aspects of the present invention can be thoroughly and concretely appreciated; however, the appended drawings are merely provided for reference and illustration, without any intention to be used for limiting the present invention.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain the principles of the present invention.

DESCRIPTION OF THE EXEMPLARY EMBODIMENTS

The detailed description set forth below in connection with the appended drawings is intended as a description of certain embodiments of the present invention, and is not intended to represent the only forms that may be developed or utilized. The description sets forth the various functions in connection with the illustrated embodiments, but it is to be understood, however, that the same or equivalent functions may be accomplished by different embodiments that are also intended to be encompassed within the scope of the present invention.

Figure 1:
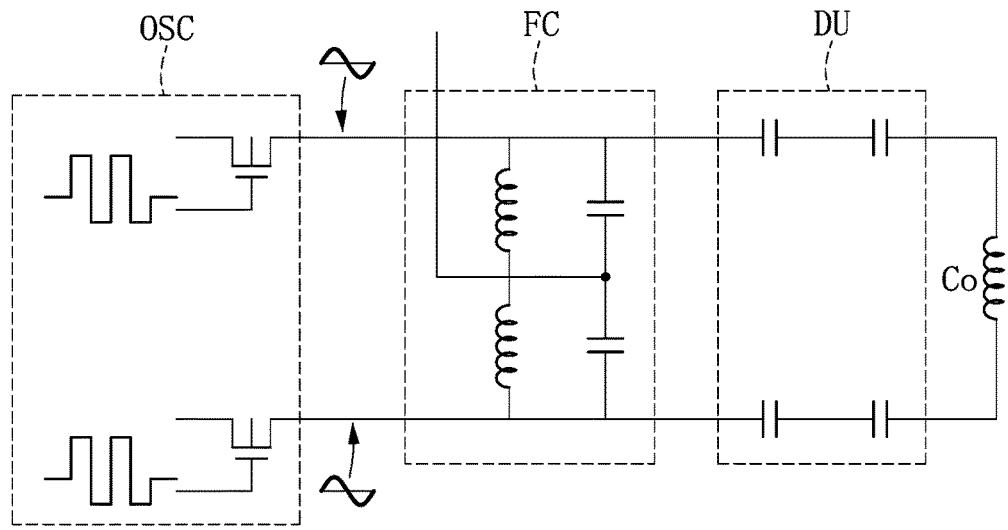
FIG. 1 is a schematic diagram of a conventional wireless charging circuit of a wireless charging board.
Figure 1A:
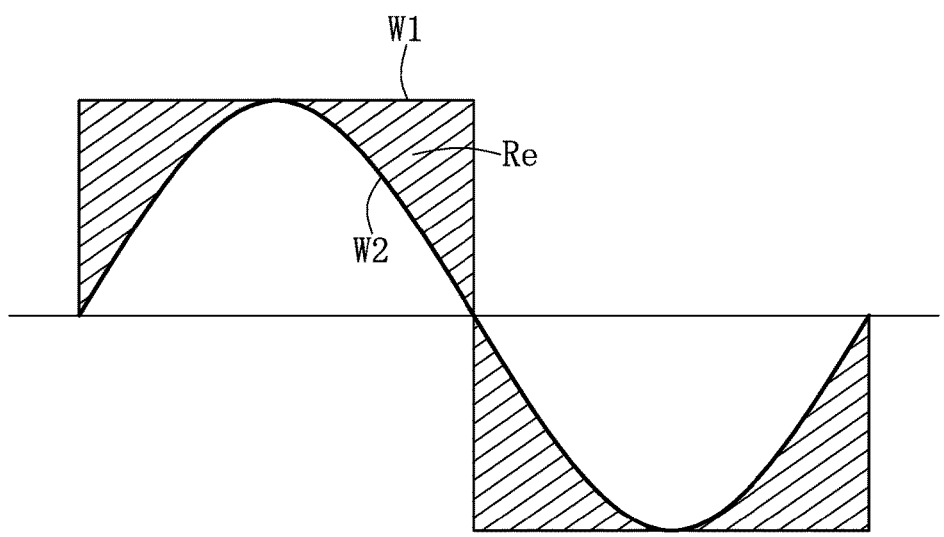
FIG. 1A is a waveform diagram of waveforms of an input signal before and after being converted by a switch of an oscillator on a conventional wireless charging board in FIG. 1.
Figure 2:
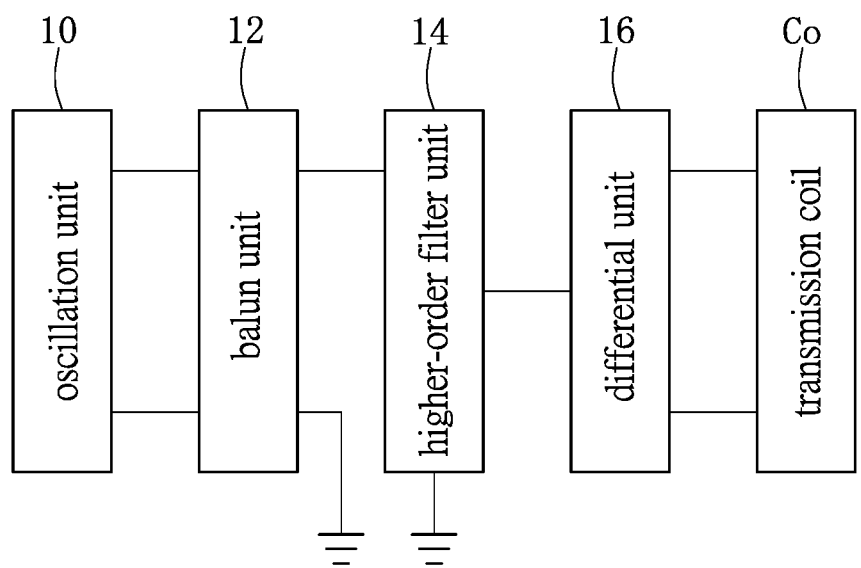
FIG. 2 is a functional block diagram of a wireless charging circuit according to one embodiment of the present invention.

FIG. 2 is a functional block diagram of a wireless charging circuit according to one embodiment of the present invention. Referring to FIG. 2, a wireless charging circuit 1 is coupled to an oscillation unit 10. The wireless charging circuit 1 includes a balun unit 12, a higher-order filter unit 14 and a differential unit 16. In practice, the balun unit 12 is coupled to the oscillation unit 10 and the higher-order filter unit 14. The differential unit 16 is coupled to the higher-order filter unit 14 and a transmission coil Co.

More particular, the balun unit 12 is implemented, for example, by a balun circuit, which is generally used between a balanced circuit and a non-balanced circuit. Two balanced inputs provide a non-balanced output via the balun circuit of the present embodiment. For example, the two balanced inputs serve as an input of a differential signal. The non-balanced output is, for example, a single output of a converted signal.

The higher-order filter unit 14 is configured to conduct higher-order attenuation and filtering on the converted signal. The higher-order filter unit 14 is implemented, for example, by a Butterworth filter, a Chebyshev filter or other filters. In practice, the higher-order filter unit 14 includes a plurality of band-pass filters and one or more low-pass filters. The low-pass filter is coupled between two adjacent band-pass filters.

In practice, the low-pass filter is configured to filter out the high-frequency components, i.e., the signals with frequencies higher than the cut-off frequency. The low-pass filter passes low-frequency signals. Moreover, the band-pass filters pass frequencies within a certain range between two cut-off frequencies. The band-pass filters are, for example, resistor-inductor-capacitor (RLC) circuits.

The band-pass filters may also include a low-pass filter and a high-pass filter. An ideal band-pass filter is supposed to have a completely flat passband, i.e., no gain/attenuation throughout the passband, and attenuate all the signals with frequencies outside the passband. Additionally, the transition out of the passband has brick wall characteristics.

In brief, the higher-order filter unit 14 is, for example, a frequency-multiplication and attenuation circuit, implemented using a plurality of capacitors and a plurality of inductors, with an attenuation of 2 to 6 dB per octave. For example, the higher-order filter unit 14 is, for example, an eighth-order filter circuit. In the same octave, the eighth-order filter circuit, as compared to a first-order filter circuit, may attenuate and filter out the 48-dB noise. The higher the order, the more significant the attenuation, and the more approximate to an ideal filter. For the first-order filter, a signal with a frequency at 10 times the cut-off frequency attenuates by 20 dB, and for a second-order filter, the same signal with a frequency at 10 times the cut-off frequency attenuates by 40 dB.

Moreover, the higher-order filter unit 14 includes a tunable inductor L4. The number of winding turns of the tunable inductor L4 is determined according to the transmission coil Co. In other words, the tunable inductor L4 is an impedance matching element of the transmission coil Co to reduce the transmitting power loss of the transmission coil Co and enhance the transmitting power of the transmission coil Co. The present invention is not limited to the example of the tunable inductor L4.

Then, the differential unit 16 is coupled to the higher-order filter unit 14 and the transmission coil Co. In practice, the differential unit 16 is implemented, for example, using a plurality of capacitors so as to issue a differential output signal to the transmission coil Co. Therefore, the transmission coil Co may output power to charge the wireless receiving devices. The person with ordinary skill in the art may design the differential unit 16 freely.

For example, the oscillation unit 10 issues a differential signal to the balun unit 12. The balun unit 12 converts the differential signal into a converted signal to be transmitted to the higher-order filter unit 14. The higher-order filter unit 14 filters the converted signal to output a filtered signal to the differential unit 16. The differential unit 16 converts the filtered signal into a differential output signal be outputted by the transmission coil Co.

In brief, in the present embodiment, the balun unit 12 converts the differential signal into a converted signal. The balun unit 12 conducts voltage conversion unlike the conventional wireless charging board which stores the energy in the capacitor. Accordingly, the balun unit 12 is prevented from electromagnetic interference due to N-times frequency multiplication caused by storing energy in the capacitor.

Furthermore, in the present embodiment, the higher-order filter unit 14 filters and attenuates the converted signal to output a filtered signal. The first-order filter attenuates the signal by 6 dB per octave. Thereby, the higher-order filter unit 14 filters out the noise with frequencies tripled, quadrupled, quintuple or multiplied, such that the noise is higher-order attenuated and the wireless charging circuit 1 conforms to the regulations for electromagnetic interference (EMI) safety.

Figure 3:
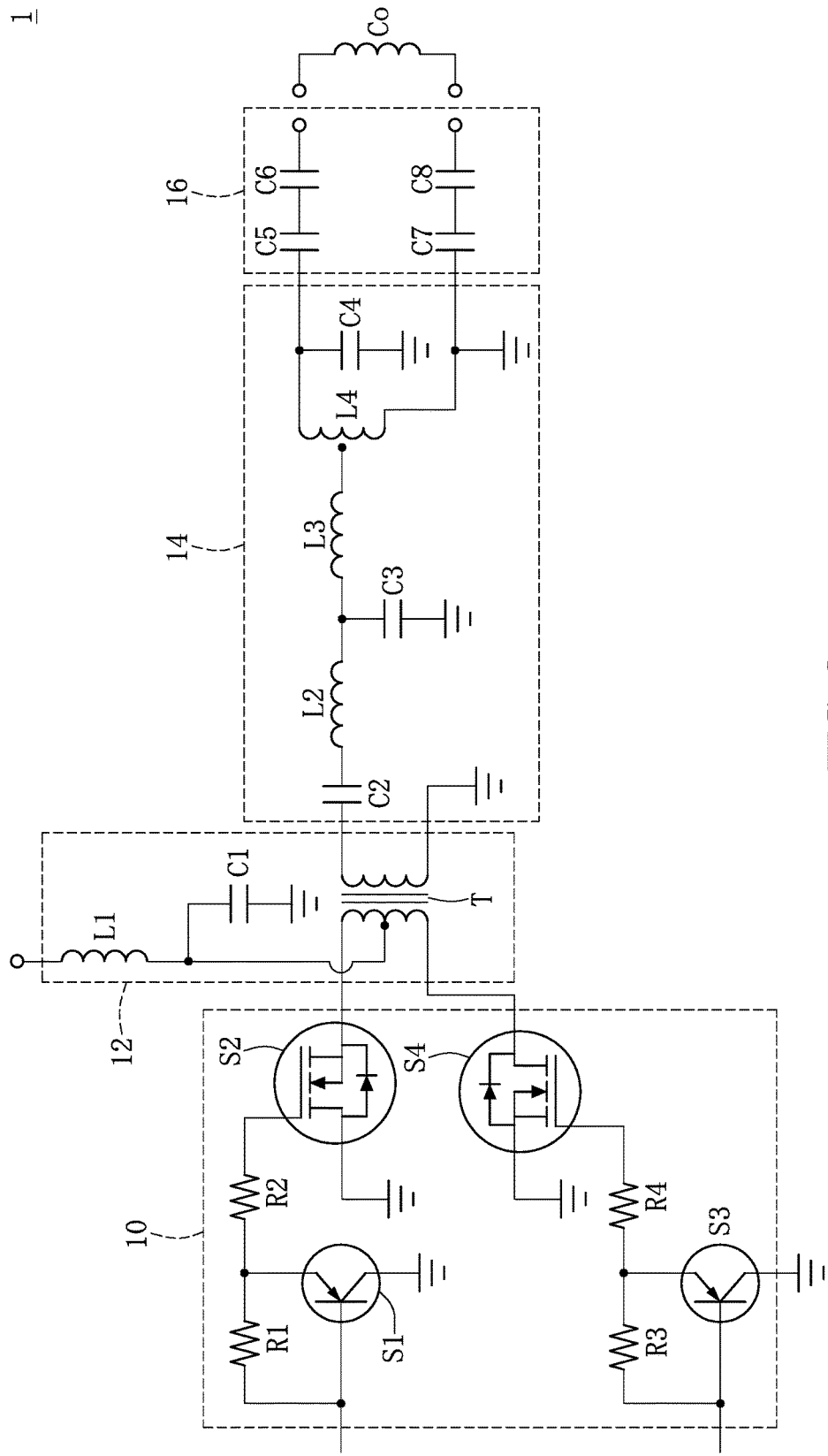
FIG. 3 is a circuit diagram of the wireless charging circuit in FIG. 2 according to one embodiment of the present invention.

FIG. 3 is a circuit diagram of the wireless charging circuit in FIG. 2 according to one embodiment of the present invention. With reference to FIG. 3, the wireless charging circuit 1 includes an oscillation unit 10, a balun unit 12, a higher-order filter unit 14, a differential unit 16 and a transmission coil Co.

More particular, the oscillation unit 10 includes four switches S1-S4 and four resistors R1-R4, namely, a first switch S1, a second switch S2, a third switch S3, a fourth switch S4 and a plurality of resistors R1-R4. The base of the first switch S1 and the base of the third switch S3 are, respectively, coupled to a controller (not shown). The emitter of the first switch S1 is coupled to the gate of the second switch S2. The emitter of the third switch S3 is coupled to the gate of the fourth switch S4.

The source of the second switch S2 is coupled to a center-tapped transformer T. The source of the fourth switch S4 is coupled to the ground. The drain of the second switch S2 is coupled to the ground. The drain of the fourth switch S4 is coupled to the center-tapped transformer T. The first switch S1 and the third switch S3 are implemented, respectively, by bipolar junction transistors (BJT's), while the third switch S3 and the fourth switch S4 are implemented, respectively, by metal-oxide-semiconductor field-effect transistors (MOSFET's).

Moreover, the first resistor R1 is coupled between the base and the emitter of the first switch S1. The second resistor R2 is coupled to the first resistor R1, the emitter of the first switch S1 and the gate of the second switch S2. The third resistor R3 is coupled between the base and the emitter of the third switch S3. The fourth resistor R4 is coupled to the third resistor R3, the emitter of the third switch S3 and the gate of the fourth switch S4.

Then, the balun unit 12 includes, for example, a first inductor L1, a first capacitor C1, a voltage source and a center-tapped transformer T. The primary side of the center-tapped transformer T is coupled to the oscillation unit 10, and the secondary side of the center-tapped transformer T is coupled to the higher-order filter unit 14 and the ground. In practice, the differential signal is inputted at both input terminals on the primary side of the center-tapped transformer T. The converted signal is outputted at one terminal on the secondary side of the center-tapped transformer T and enters the higher-order filter unit 14.

The center-tapped transformer T is implemented, for example, by an iron core transformer, a magnetic core transformer, a nickel-zinc ferrite transformer, a manganese-zinc ferrite transformer or other transformers. The winding turns ratio of the center-tapped transformer T is 1:1. The voltage from the voltage source is stepped up by the center-tapped transformer to twice the voltage from the voltage source. For example, if the voltage from the voltage source is 5 V, the voltage on the primary side of the center-tapped transformer T is 10 V and the voltage on the secondary side of the center-tapped transformer T is 20 V.

Moreover, the center tap on the primary side of the center-tapped transformer T is coupled to a first inductor L1 and a first capacitor C1. The first inductor L1 is coupled to a voltage source and the first capacitor C1. The first capacitor C1 of the balun unit 12 is coupled to the ground so as to eliminate the capacitive reactance of the first capacitor C1. In other words, the balun unit 12 is a center-tapped transformer T with no capacitive reactance such that the problems related to electromagnetic interference due to the energy denoted by the residual portion stored in the capacitor in the conventional wireless charging circuit can be overcome.

The higher-order filter unit 14 includes three capacitors C2-C4, two inductors L2-L3 and a tunable inductor L4. In practice, the higher-order filter unit 14 includes a second capacitor C2, a second inductor L2, a third capacitor C3, a third inductor L3, a tunable inductor L4 and a fourth capacitor C4.

The second capacitor C2 is coupled to the secondary side of the center-tapped transformer T and the second inductor L2. The second inductor L2 is coupled to the second capacitor C2, the third capacitor C3 and the third inductor L3. The third capacitor C3 is coupled among the ground, the second inductor L2 and the third inductor L3. The third inductor L3 is coupled to the center tap of the tunable inductor L4. The first terminal of the tunable inductor L4 is coupled to the fourth capacitor C4 and the fifth capacitor C5. The second terminal of the tunable inductor L4 is coupled to the seventh capacitor C7 and the ground.

The number of winding turns of the tunable inductor L4 is determined according to the output power of the transmission coil Co. For example, before being dispatched from the factory, the winding turns ratio of the tunable inductor L4 is fixed. For example, the number of top winding turns to the number of lower winding turns of the center tap of the tunable inductor L4 is 1:1 or X:Y, where X and Y are arbitrary integers. However, the present invention is not limited to the previous example of the tunable inductor L4.

Moreover, the second capacitor C2 and the second inductor L2 form a band-pass filter. The tunable inductor L4 and the fifth capacitor C5 form a band-pass filter. The tunable inductor L4 and the seventh capacitor C7 form a band-pass filter. The second inductor L2, the third inductor L3 and the third capacitor C3 form a low-pass filter. The third inductor L3, the tunable inductor L4 and the fourth capacitor C4 form a low-pass filter. In other words, in the present embodiment, the higher-order filter circuit may include a plurality of band-pass filters and a plurality of low-pass filters.

The differential unit 16 includes, for example, a fifth capacitor C5, a sixth capacitor C6, a seventh capacitor C7 and an eighth capacitor C8. In practice, the fifth capacitor C5 is coupled to the fourth capacitor C4, the seventh capacitor C7 and the tunable inductor L4. The sixth capacitor C6 is coupled to the fifth capacitor C5 and the transmission coil Co. The seventh capacitor C7 is coupled to the tunable inductor L4, the eighth capacitor C8 and the ground. The eighth capacitor C8 is coupled to the seventh capacitor C7 and the transmission coil Co.

The fourth capacitor C4 is coupled to the ground so as to eliminate the capacitive reactance of the fourth capacitor C4, the fifth capacitor C5, the sixth capacitor C6, the seventh capacitor C7 and the eighth capacitor C8. One end of the tunable inductor L4 is coupled to the ground so as to eliminate the inductive reactance of the tunable inductor L4. In other words, the higher-order filter circuit uses the fourth capacitor C4 to overcome the problems due to the capacitive reactance in the conventional wireless charging circuit and uses the tunable inductor L4 to overcome the problems due to the inductive reactance in the conventional wireless charging circuit.

It should be noted that the balun unit 12 has a high inductance value and the higher-order filter unit 14 has a low inductance value. The higher-order filter unit 14 is configured to attenuate and filter a noise at a frequency multiplied by N, N being an integer larger than or equal to 2. In other words, to make the wireless charging circuit 1 or the wireless charging board conform to the regulations for electromagnetic interference (EMI) safety, the higher-order filter unit 14 can be a second-order, third-order, fourth-order, eighth-order, sixteenth-order or higher-order filter circuit so as to filter out the noise at a frequency multiplied. The present invention is not limited to the examples and operations of the oscillation unit 10, the balun unit 12, the higher-order filter unit 14, the differential unit 16 and the transmission coil Co.

Figure 3A:
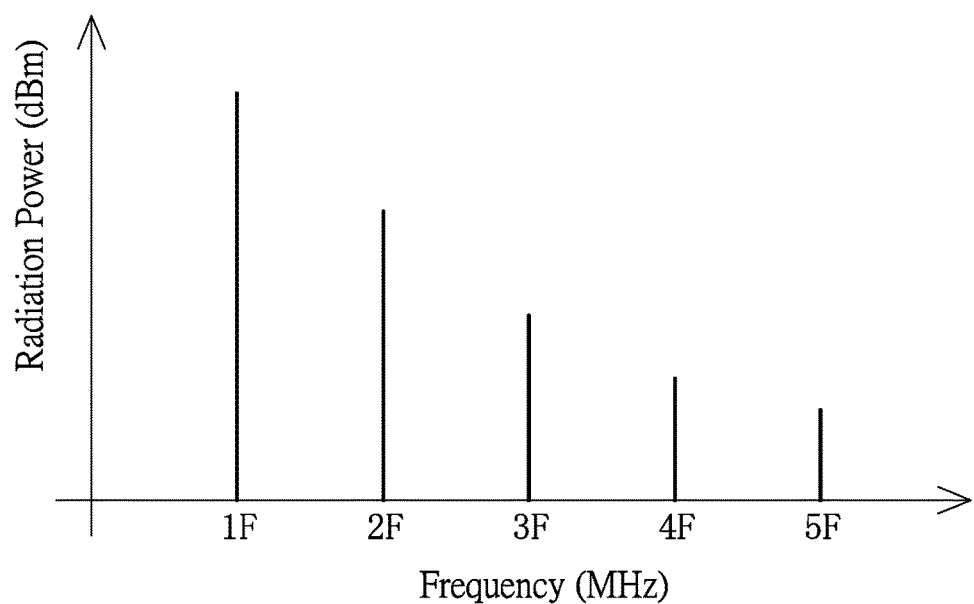
FIG. 3A is a frequency to radiation power relation of multiplied frequencies on a wireless charging circuit according to one embodiment of the present invention.

FIG. 3A is a frequency to radiation power relation of multiplied frequencies on a wireless charging circuit according to one embodiment of the present invention. With reference to FIG. 3A, for better understanding, the wireless charging board in the present embodiment conducts wirelessly charging with a 1-W output power at a 6.78-MHz resonant frequency. Therefore, the radiation power of the wireless charging board can be acquired by calculation to be 30 dBm. More particularly, the doubled frequency 2F, the tripled frequency 3F, the quadrupled frequency 4F and the quintupled frequency 5F are 13.56 MHz, 20.34 MHz, 27.12 MHz and 33.9 MHz, respectively. The attenuation is 20 Log(1/5)=−14 dB at the quintupled frequency 5F. Therefore, the radiation power at the quintupled frequency 5F is 16 dB.

Moreover, according to the regulations for electromagnetic interference (EMI) safety, the reduction of EMI for a wireless charging board is 34 dB. Therefore, the total attenuation in the present embodiment reaches 50 dB. In the present embodiment, the impedance of the tunable inductor L4 in FIG. 3 is designed to be 100 ohm. Therefore, the attenuation of the wireless charging circuit 1 in the present embodiment reaches −60 dB at the quintupled frequency 5F. In other words, in the present embodiment, the noise at the quintupled frequency 5F or higher can be filtered out with the circuit design of the balun unit 12 and the higher-order filter unit 14.

Accordingly, with the circuit design of the balun unit 12 and the higher-order filter unit 14 in the present embodiment, problems related to electromagnetic interference when wireless charging at a frequency of 6.78 MHz by the conventional wireless charging board can be overcome. Moreover, the problems related to electromagnetic interference at resonant frequencies within the range from 30 MHz to 1,000 MHz can be overcome by the person with ordinary skill in the art by designing a higher-order filter unit 14 to eliminate the noise at N-times frequency according to the spirit of the present invention, where N is an integer larger than or equal to 2. In other words, the wireless charging circuit 1 according to the present embodiment can operate and overcome the problems due to electromagnetic interference at resonant frequencies within the range from 30 MHz to 1,000 MHz.

Figure 4:
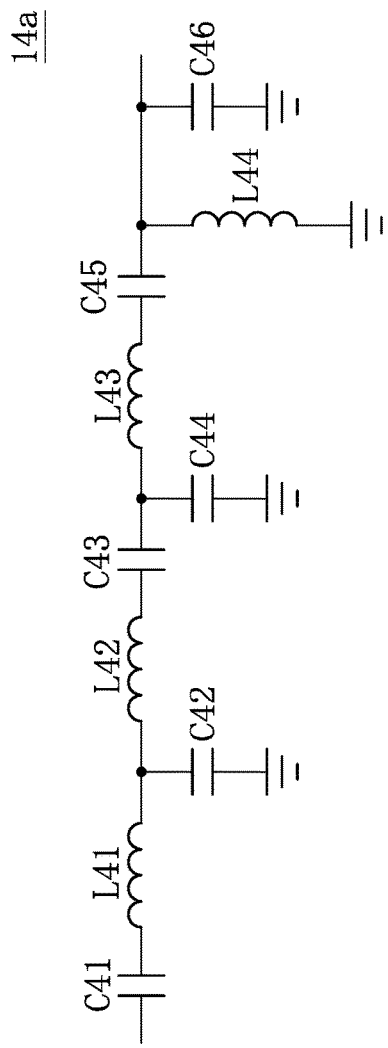
FIG. 4 is a circuit diagram of a higher-order filter unit of a wireless charging circuit in FIG. 2 according to one embodiment of the present invention.

FIG. 4 is a circuit diagram of a higher-order filter unit of a wireless charging circuit in FIG. 2 according to one embodiment of the present invention. With reference to FIG. 4, the higher-order filter unit 14a in FIG. 4 is similar to the higher-order filter unit 14 in FIG. 3 except that the higher-order filter unit 14a includes six capacitors C41-C46 and four inductors L41-L44.

Furthermore, the first capacitor C41 is coupled to the balun unit 12 and the first inductor L41. The first inductor L41 is coupled to the second inductor L42, the first capacitor C41 and the second capacitor C42. The second inductor L42 is coupled to the first inductor L41, the second capacitor C42 and the third capacitor C43. The third capacitor C43 is coupled to the second inductor L42, the third inductor L43 and the fourth capacitor C44. The third inductor L43 is coupled to the third capacitor C43, the fourth capacitor C44 and the fifth capacitor C45. The fifth capacitor C45 is coupled to the third inductor L43, the fourth inductor L44, the sixth capacitor C46 and the differential unit 16. The second capacitor C42, the fourth capacitor C44, the sixth capacitor C46 and the fourth inductor L44 are coupled to the ground, respectively.

The first capacitor C41 and the first inductor L41 form a band-pass filter. The second inductor L42 and the third capacitor C43 form a band-pass filter. The third inductor L43 and the fifth capacitor C45 form a band-pass filter. The first inductor L41, the second inductor L42 and the second capacitor C42 form a low-pass filter. The third inductor L43, the fourth inductor L44, the fifth capacitor C45 and the sixth capacitor C46 form a low-pass filter. The sixth capacitor C46 functions similarly to the fourth capacitor C4 in FIG. 3. The fourth inductor L44 functions similarly to the tunable inductor L4 in FIG. 3.

In brief, in the present embodiment, the higher-order filter unit 14a includes three band-pass filters and two low-pass filters. The three band-pass filters form a fourth-order filter and the two low-pass filters form another fourth-order filter, which equivalently results in an eighth-order filter. The first-order filter attenuates to half the signal intensity (about −6 dB) at a doubled frequency (an increment of an octave). In other words, the higher-order filter unit 14a in the present embodiment is, for example, an attenuating eighth-order filter circuit configured to attenuate and filter out the 48-dB noise such that higher-order attenuation of the wireless charging circuit conforms to the regulations for electromagnetic interference (EMI) safety.

Figure 5:
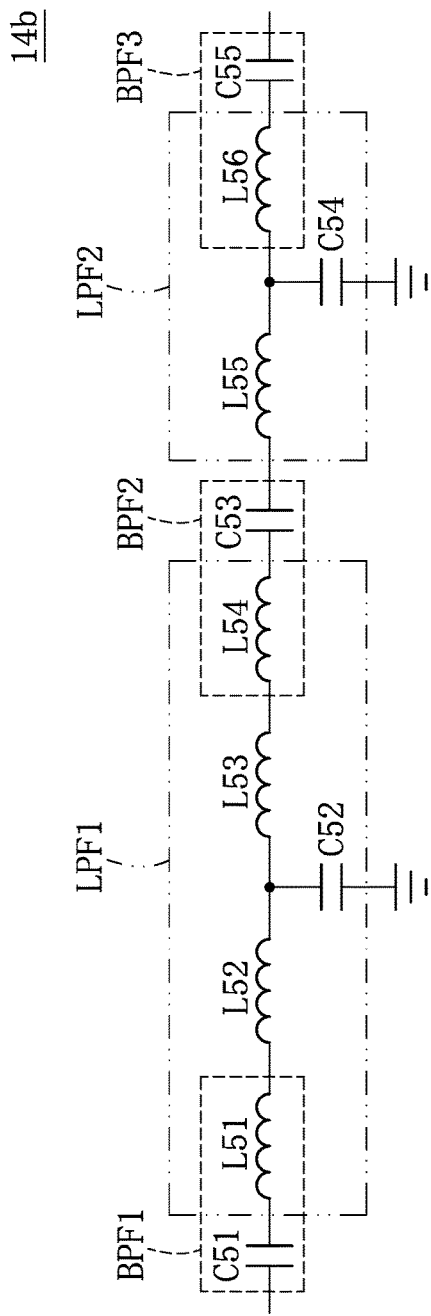
FIG. 5 is a circuit diagram of a higher-order filter unit of a wireless charging circuit in FIG. 2 according to another embodiment of the present invention.

FIG. 5 is a circuit diagram of a higher-order filter unit of a wireless charging circuit in FIG. 2 according to another embodiment of the present invention. With reference to FIG. 5, the higher-order filter unit 14b in FIG. 5 is similar to the higher-order filter unit 14 in FIG. 3 except that the higher-order filter unit 14b includes five capacitors C51-C55 and six inductors L51-L56.

Furthermore, the first capacitor C51 is coupled to the balun unit 12 and the first inductor L51. The first inductor L51 is coupled to the first capacitor C51 and the second inductor L52. The second inductor L52 is coupled to the first inductor L51, the third inductor L53 and the second capacitor C52. The third inductor L53 is coupled to the second inductor L52, the fourth inductor L54 and the second capacitor C52. The fourth inductor L54 is coupled to the third capacitor C53 and the third inductor L53. The third capacitor C53 is coupled to the fourth inductor L54 and the fifth inductor L55. The fifth inductor L55 is coupled to the third capacitor C53, the fourth capacitor C54 and the sixth inductor L56. The sixth inductor L56 is coupled to the fifth inductor L55, the fourth capacitor C54 and the fifth capacitor C55. The fifth capacitor C55 is coupled to the sixth inductor L56 and the differential unit 16. The second capacitor C52 and the fourth capacitor C54 are coupled to the ground, respectively.

The first capacitor C51 and the first inductor L51 form a first band-pass filter BPF1. The fourth inductor L54 and the third capacitor C53 form a second band-pass filter BPF2. The sixth inductor L56 and the fifth capacitor C55 form a third band-pass filter BPF3. The first inductor L51, the second inductor L52, the third inductor L53, the fourth inductor L54 and the second capacitor C52 form a first low-pass filter LPF1. The fifth inductor L55, the sixth inductor L56 and the fourth capacitor C54 form a second low-pass filter LPF2.

In brief, in the present embodiment, the higher-order filter unit 14b includes three band-pass filters and two low-pass filters. The three band-pass filters form a fourth-order filter and the two low-pass filters form another fourth-order filter, which equivalently results in an eighth-order filter. The first-order filter attenuates to half the signal intensity (about −6 dB) at a doubled frequency (an increment of an octave). In other words, the higher-order filter unit 14b in the present embodiment is, for example, an attenuating eighth-order filter circuit configured to attenuate and filter out the 48-dB noise such that higher-order attenuation of the wireless charging circuit conforms to the regulations for electromagnetic interference (EMI) safety.

Moreover, in other embodiments, the first inductor L51 and the second inductor L52 can be reduced to a single inductor. The third inductor L53 and the fourth inductor L54 can be reduced to a single inductor. The fifth inductor L55 and the sixth inductor L56 can be reduced to a single inductor. Therefore, the higher-order filter unit 14b in FIG. 5 can be reduced to the higher-order filter unit 14a in FIG. 4. The present invention is not limited to the examples of the higher-order filter unit 14b.

As previously stated, the present invention provides a wireless charging circuit including a balun unit and a higher-order filter unit. The balun unit is a center-tapped transformer configured to conduct voltage conversion unlike the conventional wireless charging board which stores the energy in the capacitor. Accordingly, the balun unit 12 is prevented from problems related to electromagnetic interference due to N-times frequency multiplication caused by storing energy in the capacitor. Furthermore, the higher-order filter unit uses a plurality of band-pass filters and one or more low-pass filter to filter and attenuate the converted signal to output a filtered signal. Thereby, the higher-order filter unit filters out the noise with frequencies tripled, quadrupled, quintuple or multiplied, such that the noise is higher-order attenuated and the wireless charging circuit 1 conforms to the regulations for electromagnetic interference (EMI) safety. Moreover, the tunable inductor is an impedance matching element of the transmission coil Co and works with the fourth capacitor coupled to the ground to eliminate the capacitive reactance and the inductive reactance of the differential unit and the transmission coil. Accordingly, the wireless charging circuit in the present embodiment overcomes the problems due to the capacitive reactance and the inductive reactance in the conventional wireless charging circuit and enhances the convenience of wireless charging.

The above-mentioned descriptions represent merely the exemplary embodiment of the present invention, without any intention to limit the scope of the present invention thereto. Various equivalent changes, alterations or modifications based on the claims of the present invention are all consequently viewed as being embraced by the scope of the present invention.

What is claimed is:

1. A wireless charging circuit coupled to an oscillation unit configured to generate a differential signal, said wireless charging circuit comprising:
    a balun unit coupled to said oscillation unit;
    a higher-order filter unit coupled to said balun unit; and
    a differential unit coupled to said higher-order filter unit and a transmission coil;
    wherein said oscillation unit transmits said differential signal to said balun unit, said balun unit converts said differential signal into a converted signal to be transmitted to said higher-order filter unit, said higher-order filter unit filters said converted signal to output a filtered signal to said differential unit, and said differential unit converts said filtered signal into a differential output signal to be outputted by said transmission coil; and
    wherein said balun is a center-tapped transformer having a primary side couple to said oscillation unit and a secondary side coupled to said higher-order filter unit, wherein a center tap on said primary side of said center-tapped transformer is couple to a first inductor and a first capacitor, said first inductor being coupled to a voltage source and said first capacitor.

2. The wireless charging circuit of claim 1, wherein said differential signal is inputted at both ends on said primary side of said center-tapped transformer, said converted signal is outputted at one end on said secondary side of said center-tapped transformer and enters said higher-order filter unit, the winding turns ratio of said center-tapped transformer is 1:1, and the voltage from said voltage source is stepped up by said center-tapped transformer to twice the voltage from said voltage source.

3. The wireless charging circuit of claim 1, wherein said first capacitor of said balun unit is coupled to the ground so as to eliminate the capacitive reactance of said first capacitor, said balun unit has a high inductance value, said higher-order filter unit has a low inductance value, and said higher-order filter unit is configured to filter a noise at a frequency multiplied by N, N being an integer larger than or equal to 2.

4. The wireless charging circuit of claim 1, wherein said higher-order filter unit comprises a second capacitor, a second inductor, a third capacitor, a third inductor, a tunable inductor and a fourth capacitor, said second capacitor being coupled to said secondary side and said second inductor of said center-tapped transformer, said third capacitor being coupled between said second inductor and said third inductor, said third inductor being coupled to a center tap of said tunable inductor, a first end of said tunable inductor being coupled to said fourth capacitor and said higher-order filter unit, and a second end of said tunable inductor being coupled to the ground and said higher-order filter unit.

5. The wireless charging circuit of claim 1, wherein said higher-order filter unit conducts higher-order attenuation and filtering on said converted signal, said higher-order filter unit comprising a plurality of band-pass filters and one or more low-pass filters, said low-pass filters being coupled between two adjacent ones of said plurality of band-pass filters, and said wireless charging circuit being configured to operate at a wireless resonant frequency within a range from 30 MHz to 1000 MHz.

6. The wireless charging circuit of claim 4, wherein said higher-order filter unit conducts higher-order attenuation and filtering on said converted signal, said higher-order filter unit comprising a plurality of band-pass filters and one or more low-pass filters, said low-pass filters being coupled between two adjacent ones of said plurality of band-pass filters, and said wireless charging circuit being configured to operate at a wireless resonant frequency within a range from 30 MHz to 1000 MHz.

7. The wireless charging circuit of claim 4, wherein said differential unit comprises a fifth capacitor, a sixth capacitor, a seventh capacitor and an eighth capacitor, said fifth capacitor being coupled to said fourth capacitor, said seventh capacitor and said tunable inductor, said sixth capacitor being coupled to said fifth capacitor and said transmission coil, said seventh capacitor being coupled to said tunable inductor, said eighth capacitor and the ground, and said eighth capacitor being coupled to said seventh capacitor and said transmission coil.

8. The wireless charging circuit of claim 6, wherein said differential unit further comprises a fifth capacitor, a sixth capacitor, a seventh capacitor and an eighth capacitor, said fourth capacitor is coupled to the ground so as to eliminate the capacitive reactance of said fourth capacitor, said fifth capacitor, said sixth capacitor, said seventh capacitor and said eighth capacitor, and said tunable inductor is coupled to the ground so as to eliminate the inductive reactance of said tunable inductor.

9. The wireless charging circuit of claim 1, wherein said center-tapped transformer is an iron core transformer, a magnetic core transformer, a nickel-zinc ferrite transformer or a manganese-zinc ferrite transformer, and the winding turns ratio of said center-tapped transformer is 1:1.

10. The wireless charging circuit of claim 1, wherein said oscillation unit comprises a first switch, a second switch, a third switch, a fourth switch and a plurality of resistors, a base of said first switch and a base of said third switch being coupled to a controller, respectively, an emitter of said first switch being coupled to a gate of said second switch, an emitter of said third switch being coupled to a gate of said fourth switch, a source of said second switch and a source of said fourth switch being coupled to the ground, respectively, a drain of said second switch and a drain of said fourth switch being coupled to said balun unit, respectively, said first switch and said third switch being bipolar junction transistors, and said third switch and said fourth switch are metal-oxide-semiconductor field-effect transistors.

11. A wireless charging board, comprising:
    a wireless charging circuit of claim 1; and
    an oscillation unit coupled to a balun unit of said wireless charging circuit and configured to generate a differential signal to be transmitted to said balun unit.

12. A wireless charging circuit coupled to an oscillation unit configured to generate a differential signal, said wireless charging circuit comprising:
    a balun unit coupled to said oscillation unit;
    a higher-order filter unit coupled to said balun unit; and
    a differential unit coupled to said higher-order filter unit and a transmission coil;
    wherein said oscillation unit transmits said differential signal to said balun unit, said balun unit converts said differential signal into a converted signal to be transmitted to said higher-order filter unit, said higher-order filter unit filters said converted signal to output a filtered signal to said differential unit, and said differential unit converts said filtered signal into a differential output signal to be outputted by said transmission coil; and
    wherein said higher-order filter unit conducts higher-order attenuation and filtering on said converted signal, said higher-order filter unit comprising a plurality of band-pass filters and one or more low-pass filters, said low-pass filters being coupled between two adjacent ones of said plurality of band-pass filters, and said wireless charging circuit being configured to operate at a wireless resonant frequency within a range from 30 MHz to 1000 MHz.

13. A wireless charging circuit coupled to an oscillation unit configured to generate a differential signal, said wireless charging circuit comprising:
    a balun unit coupled to said oscillation unit;
    a higher-order filter unit coupled to said balun unit; and
    a differential unit coupled to said higher-order filter unit and a transmission coil;
    wherein said oscillation unit transmits said differential signal to said balun unit, said balun unit converts said differential signal into a converted signal to be transmitted to said higher-order filter unit, said higher-order filter unit filters said converted signal to output a filtered signal to said differential unit, and said differential unit converts said filtered signal into a differential output signal to be outputted by said transmission coil; and
    wherein said oscillation unit comprises a first switch, a second switch, a third switch, a fourth switch and a plurality of resistors, a base of said first switch and a base of said third switch being coupled to a controller, respectively, an emitter of said first switch being coupled to a gate of said second switch, an emitter of said third switch being coupled to a gate of said fourth switch, a source of said second switch and a source of said fourth switch being coupled to the ground, respectively, a drain of said second switch and a drain of said fourth switch being coupled to said balun unit, respectively, said first switch and said third switch being bipolar junction transistors, and said third switch and said fourth switch are metal-oxide-semiconductor field-effect transistors.

* * * * *